(12) United States Patent
Armstrong

(10) Patent No.: US 6,618,828 B1
(45) Date of Patent: Sep. 9, 2003

(54) BOUNDARY SCAN TESTING INVOLVING SHARED ENABLE LATCHES

(75) Inventor: David Russell Armstrong, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/364,010

(22) Filed: Jul. 29, 1999

(51) Int. Cl.[7] .............................................. H04B 17/00
(52) U.S. Cl. ...................................................... 714/727
(58) Field of Search ................................ 714/727, 728, 714/726, 725, 724

(56) References Cited

U.S. PATENT DOCUMENTS

| | | | |
|---|---|---|---|
| 5,617,430 A | | 4/1997 | Angelotti et al. ............ 714/726 |
| 5,717,701 A | * | 2/1998 | Angelotti et al. ............ 714/727 |
| 5,757,820 A | | 5/1998 | Angelotti ..................... 714/738 |
| 5,909,452 A | | 6/1999 | Angelotti ..................... 714/726 |

* cited by examiner

Primary Examiner—Phung M. Chung
(74) Attorney, Agent, or Firm—Joseph P. Lally; Mark E. McBurney

(57) ABSTRACT

A method and an associated system and computer program product for determining sequences suitable for testing an electronic system that is comprised of a set of nets. Each net of the system provides an interconnect between a set of nodes. The method includes a step in which nodes that are enabled by a common enable latch within the system are identified. Each commonly enabled node is associated with a node group. Each node group includes the set of nodes that share a common enable latch. Contending node group pairs within the system are then identified. A contending node group pair is any pair of node groups in which at least one commonly enabled node of the first node group and at least one node of the second node group reside on a common net. Sequence numbers, preferably for use in defining a boundary scan test sequence, are then assigned to each commonly enabled node in the system. The assignment of the sequence numbers is performed such that sequence numbers for each node within a node group are the same, while sequence numbers associated with pairs of contending node groups differ. In one embodiment, the method further includes the step of assigning sequence numbers to nodes that are controlled by a dedicated (i.e., non-shared) enable latch. In one embodiment, the assignment of test sequences is optimized to maximize the number of nodes that are driven during a selected test sequence to maximize test coverage for a shorted nets test.

24 Claims, 6 Drawing Sheets

| LOOP | NET | SEQ 1 | SEQ 2 | SEQ 3 | CONTENDING NODE PAIRS |
|---|---|---|---|---|---|
| 1 | 1ST NET 401a | B.1.1.G | A.1.1.G | | (A.1,B.1) |
| 2 | 1ST NET 401a | B.1.1.G | A.1.1.G | | (A.1,B.1) |
|   | 2ND NET 401b | B.1.2.G | C.1.1.G | | (B.1,C.1) |
| 3 | 1ST NET 401a | B.1.1.G | A.1.1.G | | (A.1,B.1) |
|   | 2ND NET 401b | B.1.2.G | (C.1.1.G) | | (B.1,C.1) |
|   | 3RD NET 401c | | A.1.2.G | C.1.2.G | (A.1,C.1) |
| 4 | 1ST NET 401a | B.1.1.G | A.1.1.G | | (A.1,B.1) |
|   | 2ND NET 401b | B.1.2.G | | C.1.1.G | (B.1,C.1) |
|   | 3RD NET 401c | | A.1.2.G | C.1.2.G | (A.1,C.1) |
|   | 4TH NET 401d | D.1.1.G | | C.1.3.G | (C.1,D.1) |
| 5 | 1ST NET 401a | B.1.1.G | A.1.1.G | | (A.1,B.1) |
|   | 2ND NET 401b | B.1.2.G | | C.1.1.G | (B.1,C.1) |
|   | 3RD NET 401c | | A.1.2.G | C.1.2.G | (A.1,C.1) |
|   | 4TH NET 401d | D.1.1.G | | C.1.3.G | (C.1,D.1) |
|   | 5TH NET 401e | D.1.2.G | | C.1.4.G | |
| 6 | 1ST NET 401a | B.1.1.G | A.1.1.G | Z.99.99 | (A.1,B.1) |
|   | 2ND NET 401b | B.1.2.G | Z.99.99 | C.1.1.G | (B.1,C.1) |
|   | 3RD NET 401c | (B.2.1) | A.1.2.G | C.1.2.G | (A.1,C.1) |
|   | 4TH NET 401d | D.1.1.G | Z.99.99 | C.1.3.G | (C.1,D.1) |
|   | 5TH NET 401e | D.1.2.G | Z.99.99 | C.1.4.G | |

BOUNDARY SCAN TESTING INVOLVING SHARED ENABLE LATCHES

BACKGROUND

1. Field of the Present Invention

The present invention generally relates to the field of testing electronic systems and more particularly to strategies for generating boundary scan test sequences for a system that includes one or more nodes enabled by a common enable latch.

2. History of Related Art

The use of boundary scan testing as disclosed in IEEE Standard 1149.1 "Standard Test Access Port and Boundary-Scan Architecture" to test the various assemblies and components of an electronic system is well known. In addition to enabling the testing of the functionality of a particular integrated circuit, boundary scan testing is useful in testing the interconnections between two or more integrated circuits. See, e.g., Angelotti, Apparatus and Method for Testing Interconnections between Semiconductor Devices, U.S. Pat. No. 5,717,701; Angelotti, Method for Testing Interconnections Between Integrated circuits Using a Dynamically Generated Interconnect Topology Model, U.S. Pat. No. 5,757,820; and Angelotti, Method for Avoiding contention During Boundary Scan Testing, U.S. Pat. No. 5,909,452 (hereinafter referred to as the "'452 patent"); all of which are incorporated by reference herein. In particular, the '452 patent discloses the arranging of boundary scan test sequences to avoid contention on a system net during a state transition. As an example, a sequence of boundary scan tests may produce a transition from a state in which a first node of a net drives the net with a "1" to a state in which a second node drives the net with a "0." The '452 patent is primarily addressed to reducing or eliminating contention between the two drivers during the transition period. This type of contention is referred to in this disclosure as inter-sequence contention. Referring to FIG. 1, a simplified block diagram of an electronic system 100 for use with an electronic test sequence generated according to the prior art is presented. System 100 includes a set of integrated circuit modules or devices 110, 120, and 130 that are interconnected via a set of nets 101, 102, 103, and 104. Each net connects a set of nodes. As examples, Net 1 101 connects nodes 114a, 134a, and 124c while Net 2 102 connects nodes 114b and 134b, and so forth. Each integrated circuit includes a set of boundary scan cells that are suitable for use with a boundary scan test. More specifically, first integrated circuit 110 includes a set of boundary scan cells 111a, 111b, 111c, 112a, 112b, and 112c. Boundary scan cells 111a, 111b, and 111c are referred to herein as logic scan cells. Each logic scan cell is coupled (via a connection not depicted in FIG. 1) to a logic circuit of integrated circuit 110. Boundary scan cells 112a, 112b, and 112c are referred to herein as enable scan cells. Each enable scan cell 112 controls a corresponding driver 113 of integrated circuit 110. Each driver 113 drives an output signal from a corresponding logic cell 111 onto a corresponding node 114. Similarly with respect to second integrated circuit 120, where each node 124 is driven by a corresponding driver 123, which is enabled by a corresponding enable scan cell 122, and with respect to third integrated circuit 130, where each node 134 is driven by a corresponding driver circuit 133, which is enabled by a corresponding enable scan cell 132.

It will be appreciated that each scan enable cell 112, 122, and 132 includes, at a minimum, a latch circuit that con-

2 sumes valuable area of the corresponding integrated circuit device. For a variety of reasons including the desire to reduce die size, the use of standardized library packages, and a lack of awareness with respect to how particular designs can affect the testing of the device, scan enable cells 112 are frequently eliminated from a design. More specifically, it is not uncommon to encounter boundary scan implementations in which the driver circuits for multiple scan logic cells are controlled by a common or shared scan enable cell. Utilizing a common enable cell to control multiple driver circuits beneficially reduces the transistor count of the design but, unfortunately, introduces a level of complexity to the process of generating boundary scan test sequences that has not been previously considered. In particular, the presence of nodes that are tied to driver circuits controlled by a common enable circuit can produce a condition in which two or more nodes attempt to simultaneously drive a given net when conventional test sequence generation schemes are employed. The potential damage that contending driver circuits can cause to the reliability and functionality of their corresponding devices makes it highly desirable to devise a method and system that accounts for the possibility of commonly enabled driver circuits.

SUMMARY OF THE INVENTION

The problems identified above are in large part addressed by a boundary scan test sequence generation method and an associated system and computer program product that account for designs in which multiple nodes are enabled by a common enable latch. Broadly, speaking the invention contemplates a method of determining sequences for testing an electronic system that is comprised of a set of nets. Each net of the system provides an interconnect between a set of nodes. The method includes a step in which nodes that are enabled by a common enable latch (referred to herein as commonly enabled nodes) within the system are identified. Each commonly enabled node is associated with a node group. Each node group includes the set of nodes that share a common enable latch. Contending node group pairs within the system are then identified. A contending node group pair is any pair of node groups in which at least one commonly enabled node of the first node group and at least one node of the second node group share a common net. Sequence numbers, preferably for use in defining a boundary scan test sequence, are then assigned to each commonly enabled node in the system. The assignment of the sequence numbers is performed such that sequence numbers for each node within a node group are the same, while sequence numbers associated with pairs of contending node groups differ. In one embodiment, the method further includes the step of assigning sequence numbers to nodes that are controlled by a dedicated (i.e., non-shared) enable latch. The assignment of commonly enabled nodes is preferably prioritized over the assignment of non-shared nodes.

In one embodiment, the steps of identifying contending node group pairs and assigning sequence numbers to each commonly enabled node is achieved with a reiterative process that is repeated for each net in the system and for each node on each net. Initially, a sequence number is assigned to the commonly enabled node. Then it is determined whether the sequence number assigned to the current node results in "intrasequence" contention with a commonly enabled node of a previous net. Intrasequence contention results if the sequence number assigned to the current node matches the sequence number assigned to a previous node and the two nodes belong to contending node group pairs. That is, contention results if at least one node from the node group to which the current node belongs is connected to at least one node from the node group of the previous node via at least one net of the system and the two nodes share a common sequence number. Thus, the term intrasequence contention is used in this disclosure to emphasize a distinction between the type of contention addressed by the present invention and the contention under consideration in the '452 patent discussed in the background section above. If the sequence number assigned to the current node does result in intrasequence contention, a new sequence number that does not generate contention is determined for the current node. When a new sequence number is assigned to a node, the new sequence number is then assigned to all previously considered nodes from the same node group as the current node.

In the preferred embodiment, the lowest available sequence number that is not assigned to another node of the current net is assigned to the current node. In this manner, .the invention attempts to provide coverage for all nodes in the fewest number of sequences to reduce test time. In the preferred embodiment, the step of assigning a sequence number to a commonly enabled node includes first determining whether a commonly enabled node from the same node group was previously assigned a sequence number and, if so, assigning the same sequence number to the current node. After the test sequences have been generated according to the present invention, the method may further include using the assigned sequences to perform a stuck drivers test on each node of system to determine whether there is basic continuity between each node and its corresponding net where the generated sequence determines the order in which the system nodes drive their corresponding nets. A test to detect unintended shorts between the various nets of the system may then be executed using, in one embodiment, a selected test sequence that is optimized to drive the maximum number of nets.

BRIEF DESCRIPTION OF THE DRAWINGS

Other objects and advantages of the invention will become apparent upon reading the following detailed description and upon reference to the accompanying drawings in which:

FIG. 5 is a table illustrating the method of the present invention with respect to the electronic system depicted in FIG. 4.

Figure 1:
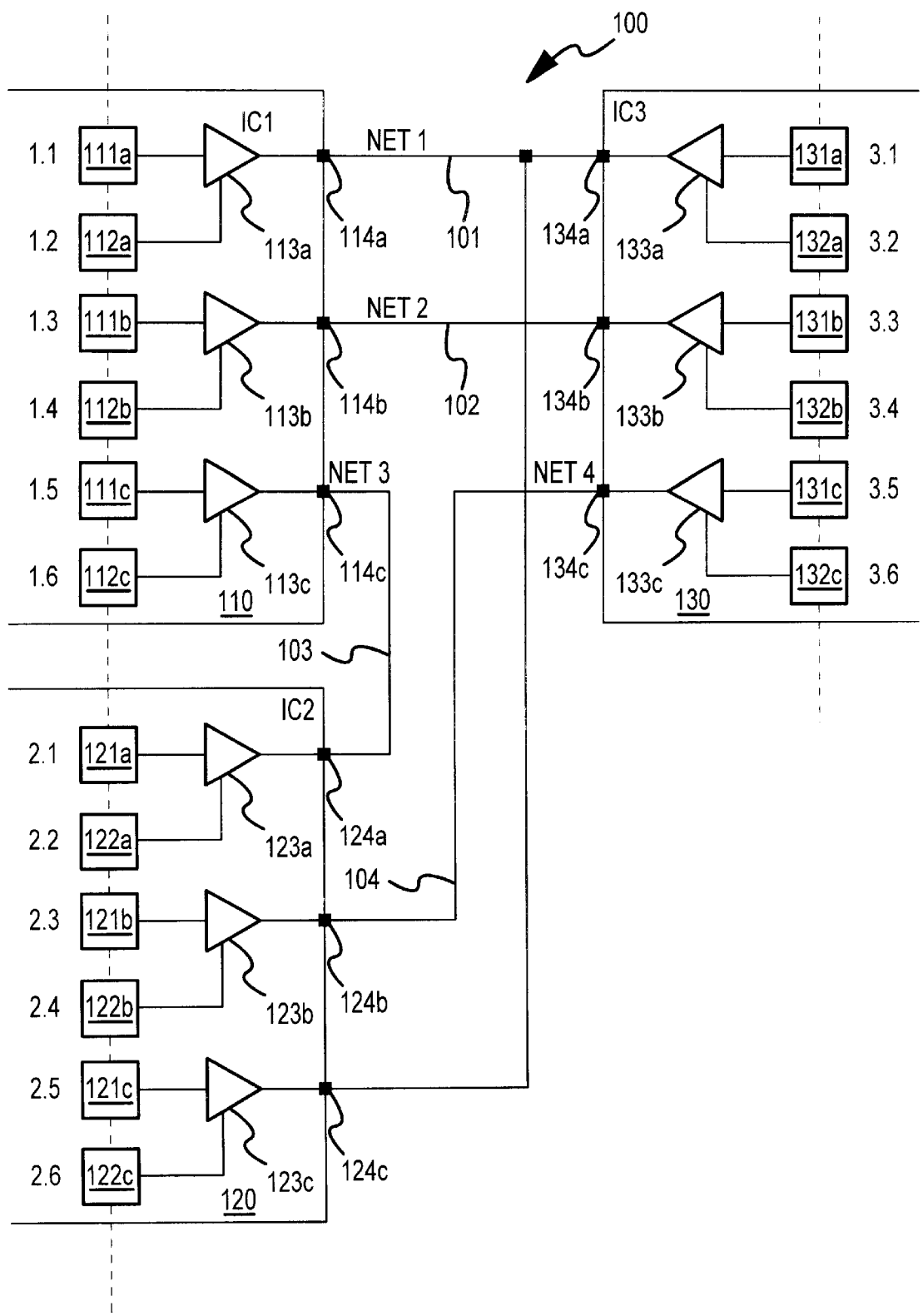
FIG. 1 is diagram of a electronic system suitable for use with a test sequence generation method according to the prior art.

While the invention is amenable to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF A PREFERRED EMBODIMENT OF THE PRESENT INVENTION

Figure 2:
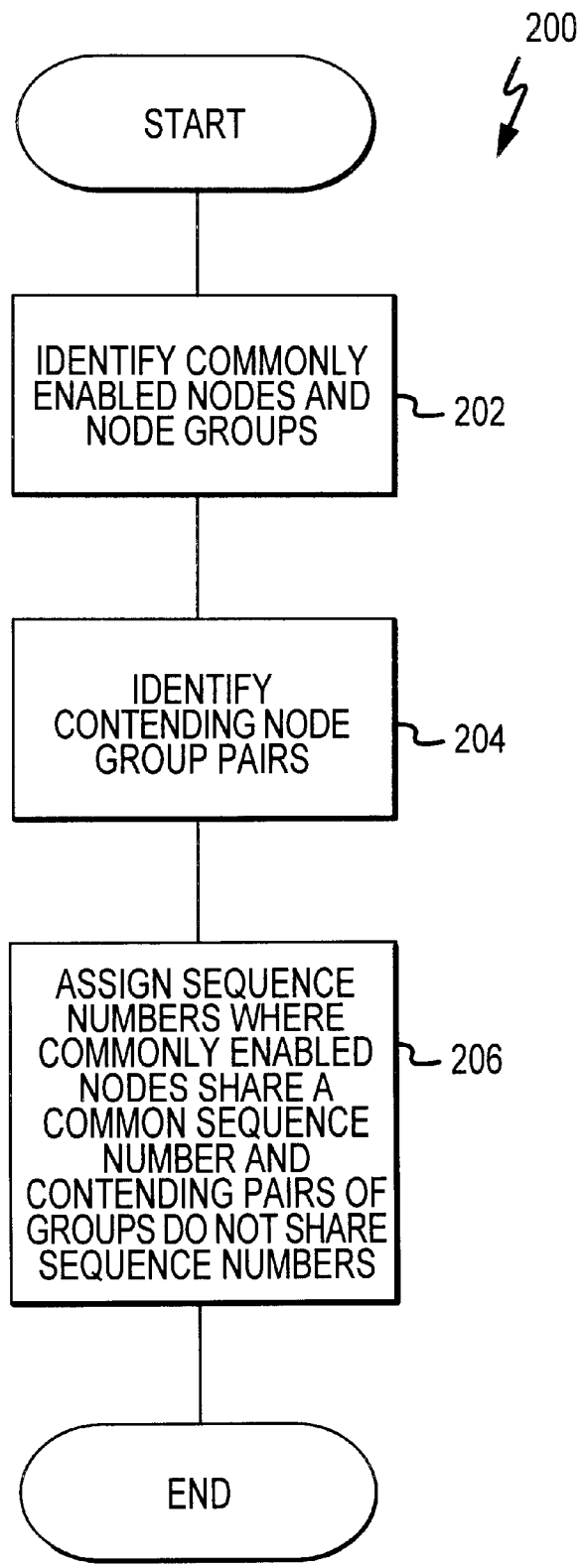
FIG. 2 is flow diagram of a method of generating test sequences according to one embodiment of the invention.
Figure 4:
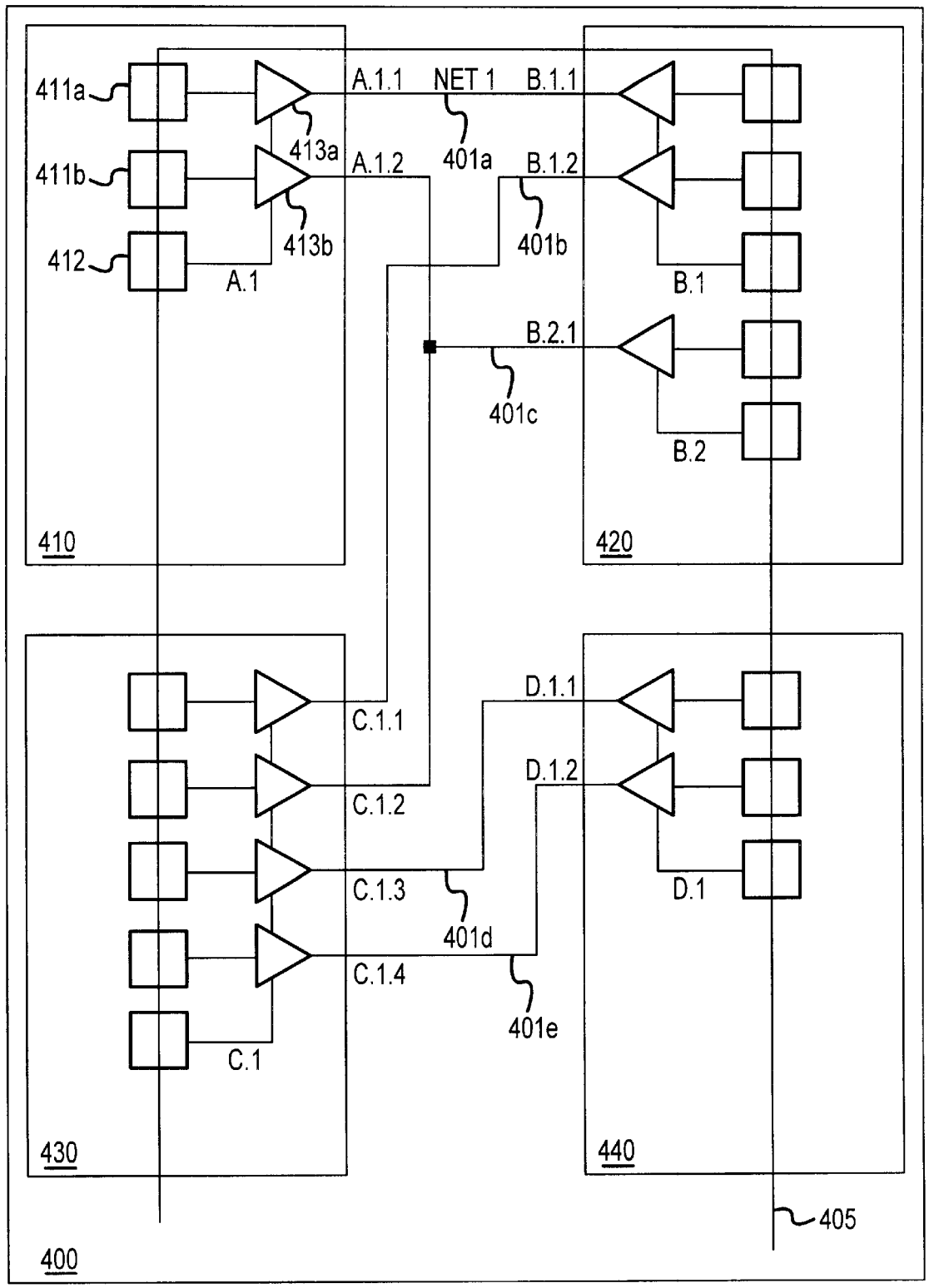
FIG. 4 is a block diagram of an electronic system suitable for use with the test sequence generation method of the present invention.

Turning now to the drawings, FIG. 2 presents a flow diagram of a method 200 of generating testing sequences for an electronic system. The generated test sequences are suitable for testing the system preferably using a boundary scan test strategy. The electronic system includes a plurality of nets. Each net provides a conductive path or interconnect between system nodes of the system. The first step 202 of method 200 includes identifying commonly enabled nodes of the system. Referring momentarily to FIG. 4, an electronic system 400 suitable for use with the method 200 of FIG. 2 is depicted. The system 400 may suitably represent one or more printed circuit boards each of which includes one or more integrated circuit modules that are interconnected via a set of conductive paths or nets. The depicted embodiment of system 400 includes a set of devices or modules 410, 420, 430, and 440 although it will readily be appreciated that system 400 will typically include a far greater number of modules and nets. Each module includes a set of nodes that are interconnected with other nodes in system 400 via a set of nets. The example of system 400 shown in FIG. 4 includes a set of five nets 401*a,* 401*b,* 401*c,* 401*d,* and 401*e* (generically or collectively referred to herein as net or nets 401). First device 410 includes a set of nodes identified by reference characters A.1.1 and A.1.2. Each node is coupled to the output of a corresponding driver circuit. Node A.1.1, for instance, is driven by driver circuit 413*a* while node A.1.2 is driven by driver circuit 413*b* (collectively or generically referred to herein as driver circuits 413). Driver circuits 413*a* and 413*b* of first device 410 are controlled by a common enable latch 412. The set of drivers 413 controlled by enable latch 412 are referred to in this disclosure as a set of commonly enabled drivers. Similarly, the nodes A.1.1 and A.1.2 that are driven by the set of commonly enabled drivers 413 are referred to as commonly enabled nodes to emphasize that, whenever a node, such as node A.1.1, of the commonly enabled set of nodes is driven by its corresponding driver 413*a,* all other nodes in the set of commonly enabled nodes are driven by their respective driver circuits 413. A set of commonly enabled nodes is also referred to in this disclosure as a node group and identified by reference character indicative of the module and enable latch that define the node group. Thus, the node group consisting of nodes A.1.1 and A.1.2, for example, is identified by the reference character A.1, where the "A" indicates first module 410 and the "1" indicates the first enable latch 412. In the example of system 400 depicted in FIG. 4, first module 410 includes a node group A.1 that includes nodes A.1.1 and A.1.2, second module 420 includes a node group B.1 that includes nodes B.1.1 and B.1.2, third module 430 includes a node group C.1 that includes nodes C.1.1, C.1.2, C.1.3, and C.1.4 while fourth module 440 includes a node group D.1 that includes nodes D.1.1 and D.1.2.

Returning to the flow diagram of FIG. 2, test sequence generation method 200 includes a step 202 in which all commonly enabled nodes and node groups are identified. Method 200 presumes the existence of a system boundary scan model that includes information about the boundary scan cells of system 400. As indicated previously, test sequence generation method 200 is preferably used in conjunction with a boundary scan test of system 400. The boundary scan cells of system 400 are connected by the scan chain 405. The boundary scan cells are connected in serial fashion to form an extended shift register which can be loaded to a predetermined state by placing the device in a test mode using boundary scan control, data, and clock signals that are received by well defined boundary scan interface circuitry that is incorporated into system 400 (but not shown in FIG. 4). From the boundary scan model of system 400, method 200 identifies the system nodes that share a common enable latch and groups the set of all commonly enabled nodes according to their corresponding latch circuits. As an example, identification step 202 of method 200 determines that enable scan cell 412 is responsible for enabling logic scan cells 411a and 411b. The nodes corresponding to these scan cells, namely, nodes A.1.1 and A.1.2 are labeled as commonly enabled nodes and associated with a node group A.1. In similar fashion, nodes B.1.1 and B.1.2 are labeled as commonly enabled nodes and associated with a node group B.1 and so forth with respect to the remaining modules of system 400.

After identifying the various commonly enabled nodes and node groups in system 400, contending node group pairs are identified in step 204 of method 200. As discussed previously, a pair of node groups is referred to herein as a contending pair of node groups if any node of the first node group is connected to any node of the second node group via any net 401 of system 400. For example, because first net 401a of system 400 connects node A.1.1 of first module 410 and node B.1.1 of second module 420, node groups A.1 and B.1 form a contending node group pair. Contending node group pairs are identified in the present invention to address testing constraints imposed by the use of shared enable latches in system 400. Because it is not possible to drive one node of a node group without driving all other nodes of the same node group, contention must be considered not only with respect to the node under consideration but also with respect to all other nodes (and their associated nets) in the node group. As an example, because node A.1.1 is connected to node B.1.1, it is intuitive that A.1.1 and B.1.1 cannot be driven simultaneously without running the risk of having the two nodes contend for control of first net 401a. Because, however, nodes A.1.1 and B.1.1 are both commonly enabled nodes, the possibility for contention extends beyond the net connecting the two nodes. More specifically, not only should an optimized test sequence prevent node A.1.1 and node B.1.1 from driving first net 401a simultaneously, but it should also prevent any node of node group A.1 and any node of node group B.1 from simultaneously driving their respective nets. A brute force approach to prevent contention in system 400 would be to simply assign each module its own dedicated test sequence number. While this type of approach would prevent contention on contending node group pairs, it would frequently if not always result in a the generation of more test sequences than would be necessary to otherwise test all nodes of the system. The identification of contending node groups pairs permits method 200 to prevent contention while also minimizing the number of sequences required to achieve adequate test coverage. Also, unless one module can drive all the nets of the system, the brute force approach would limit shorted nets test coverage.

Sequence numbers are assigned to each node of system 400 in step 206 of method 200 in conjunction with the identification of contending node group pairs in step 204. The sequence numbers are assigned to the various nodes of system 400 using two rules. First, the sequence number assigned to each node of any node group must be the same. Second, the sequence numbers assigned to nodes of contending node group pairs must differ. (In one embodiment a third rule may be used to ensure that a selected sequence includes a driver for all nets 401 which will be discussed in greater detail in subsequent paragraphs of this disclosusre). Assigning sequence numbers under these constraints permits method 200 to prevent contention without simply requiring each module to occupy its own test sequence number thereby guaranteeing complete test coverage without jeopardizing the reliable operation of the system and without unnecessarily consuming valuable test time.

Figure 3:
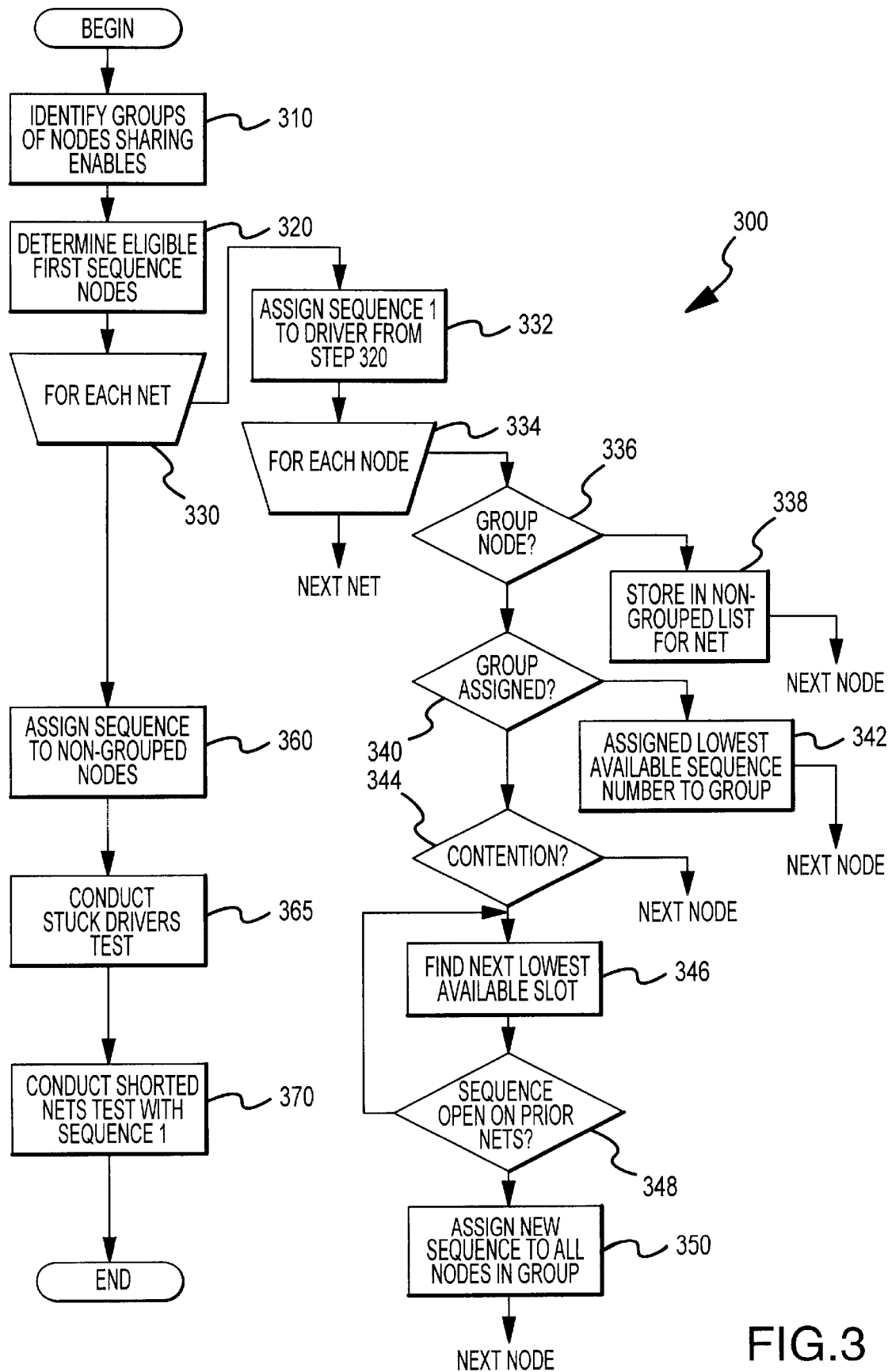
FIG. 3 is a flow diagram of a method of generating test sequences according to one embodiment of the invention.

Referring now to FIG. 3 and FIG. 5, FIG. 3 is a flow diagram of a method 300 for generating sequences to test an electronic system such as system 400 according to one embodiment of the method 200 described above while FIG. 5 depicts a table illustrating the generation of test sequences for system 400 according to method 300. In step 310, method 300 identifies groups of nodes that share an enable latch. In the preferred embodiment, the identification of the commonly enabled nodes is derived from boundary scan model of system 400. The nodes identified during step 310 as commonly enabled nodes are indicated in the table of FIG. 5 by the letter "G" after the node identifier (to indicate that the node is part of a group). For example, node A.1.1 is determined to be a commonly enabled node in step 310 and is indicated in table 500 as node A.1.1.G. The commonly enabled node identifier enables the remaining portions of method 300 to distinguish between commonly enabled nodes, which require heightened processing, and dedicated (non-shared) nodes. In a preliminary step 320, as discussed in greater detail in subsequent paragraphs of this disclosure pertaining to the testing of system 400 for short circuits, logic reduction is used to determine that group nodes B.1 and D.1 are the eligible drivers for a selected test sequence. In the depicted example, the selected sequence is the first sequence, although it will be appreciated that another sequence may be used as the selected sequence. Method 300 then begins loop 330, which is executed for each net 401 of system 400. For embodiments of method 300 that include the logic reduction step 320, Loop 330 includes an initial step 332 in which a driver determined in step 320 is assigned to the selected sequence for the current net (unless the selected sequence has been reserved for a dedicated node as discussed in paragraphs to follow). A subloop 334 is then executed for each node of the net under consideration. A decision is made in step 336 based on whether the current node is a group enabled node. If the current node is not a group enabled node, the node is stored in a non-group node list for processing after all group enabled nodes have been assigned sequences. If the current node is a group enabled node, a decision is made in step 340 based on whether the node group to which the current node belongs has been assigned a sequence number. If the current node has not been assigned a sequence number, the lowest available sequence number is assigned to the node group of the current node in step 342. The lowest available sequence number is the lowest sequence number that has not already been assigned to another node of the net under consideration. If the node group to which the node under consideration has been assigned a sequence, a check is made in step 344 to determine whether the assigned sequence number is in contention with another node on this net. If the sequence number assigned to the current node is in contention with another node, the next lowest available sequence number is determined in step 346. A check is made in step 348 to see if the new sequence number produces contention with previous nets to which the node group of the current node is connected. If the newly assigned sequence number conflicts with a previous net, step 346 and 348 are repeated until a sequence number that does not result in contention is found. When an acceptable sequence number is found in step 348, it is assigned in step 350 to all nodes in the node group.

The method 300 described above is best illustrated by way of example with respect to the system 400 depicted in FIG. 4. The results of the example are indicated in the table 500 of FIG. 5. A first row 501 of table 500 indicates the results of the sequence generation method 300 after loop 334 has been executed for each node of first net 401a. Initially all sequence numbers are available. In step 320, as described in more detail in subsequent paragraphs, method 300 determines that node groups B.1 and D.1 are eligible choices for the first test sequence. Loop 330 is then entered for first net 401a. In step 332, node B.1 is assigned to the first sequence based upon the results of step 320. Subloop 334 is then executed once for each remaining node of first net 401a. Since there is only one remaining node, node A.1.1.G, on first net 401a, subloop 334 is executed just a single time before proceeding to second net 401b. In step 336, node A.1.1.G is recognized as a group node. In step 340, it is recognized that node group to which node A.1.1.G belongs (node group A.1) has not previously been assigned a sequence number. Since node A.1 is ineligible to occupy sequence one based on the results of step 320, sequence two is assigned to node A.1.1.G. Since both nodes of first net 401a are commonly enabled nodes, the node groups A.1 and B.1 are now recognized as a contending node group pair as indicated in table 500 of FIG. 5.

In row 502 of table 500, second net 401b is processed in a similar fashion. The first commonly enabled node of second net 401b (node B.1.2.G) is assigned sequence number one as determined in step 320 and to comply with the requirement that all node group B.1 nodes have the same sequence number since node B.1.1.G was assigned sequence number one in row 501 of table 500. When node C.1.1.G of net 401b is processed in subloop 334, the lowest available sequence number is sequence two because node group C.1 is ineligible to occupy sequence one from step 320, no other node on net 401b has been assigned sequence number two and no node group with which node group C.1 contends (at this point in time) has been assigned sequence number two. The pair of node groups B.1 and C.1 are now recognized as a contending node group pair.

In third row 503, third net 401c is processed. Group node A.1.2.G is assigned sequence number two consistent with the assignment of sequence number two to node A.1.1.G that occurred in row 501 of table 500. When node B.2.1 is processed, it is recognized a dedicated node in step 336 and stored in a list of dedicated or non-grouped nodes in step 338. When node C.1.2.G is processed, however, a conflict is discovered. More specifically, a previous occurrence of a node from node group C.1, namely node C.1.1.G, was assigned sequence two (in row 502 of table 500), but sequence two is now assigned to another node of third net 401c, namely node A.1.2.G. This conflict is addressed by the decision box 344 of method 300. Since the sequence number currently assigned to node group C.1 (sequence two) now contends with the sequence number assigned to node group A.1, a new sequence number is determined for node group C.1 in step 346. Referring to row 503 of table 500, the result of this sequence is that sequence number three is assigned to node C.1.2.G for net 3 401c to avoid contention with nodes from node groups with which node group C.1 contends (i.e., node groups A.1 and B.1). Because each node group must be associated with a single sequence, previous occurrences of nodes from node group C.1 must be reassigned with the new sequence number in step 350. Specifically, node C.1.1.G, which was assigned sequence two in row 502, is reassigned to sequence three consistent with the sequence number for node C.1.2.G. This sequence number change for node C.1.1.G is indicated in row 503, which also includes the recognition of node group pair A.1 and C.1 as a contending pair.

In row 504 of table 500, a fourth net 401d is processed. Node D.1.1.G is assigned sequence one in step 332 since it is an eligible sequence one driver from step 320. Node C.1.3.G is assigned sequence number three consistent with previous occurrences of nodes from node group C.1. Although node group B.1 is assigned to sequence number one, no conflict is present because there is no node connected between node group B.1 and node group D.1. In other words, node D.1.1.G and node B.1.1.G can be driven simultaneously by their respective drivers without contention. In row 505 of table 500, a fifth net 401e is processed in the same manner as fourth net 401d. By assigning sequence one to node group D.1, a full verification of all nodes in the system can be accomplished in three sequences rather than the four sequences that would be required if all modules were simply assigned unique sequence numbers. In this manner, method 300 ensures that intrasequence contention is avoided while optimizing the number of test sequences required.

Having completed loop 330 for each net 401 in system 400, method 300 proceed to step 360, in which the dedicated nodes identified in the preceding sequence are assigned to available sequence slots for their respective nodes. In the example system, dedicated node B.2.1 is assigned to sequence one for the third net 401c as shown in row 506 of table 500, which represents the final test sequence solution generated by method 300. The generated test sequences may then be used to implement continuity and shorts tests to verify the interconnections between the nodes of system 400. It will be appreciated by those having the benefit of this disclosure that each node is assigned a sequence for testing upon completion of method 300. Moreover, each net 401 is driven during test sequence number one and the number of sequences is less than the number of modules. Thus, method 300 has generated a suitable test sequence for system 400. A stuck drivers test is then performed in step 365 by sequentially forcing each net to a "1" and "0" state from each node of the net using the generated test sequence. Referring to row 506 of table 500, it is seen that first net 401 a will be driven by node B.1.1.G during sequence one and node A.1.1.G during sequence two. Second net 401b will be driven by node B.1.2.G during sequence one and node C.1.1.G during sequence three. Second net 401b will not be driven during sequence two and the filler node Z.99.99 is indicated. Similarly, third net 401c will be driven by node B.2.1 during sequence one, node A.1.2.G during sequence two, and node C.1.2.G during sequence three. In the same manner, the remaining driver, nodes, and nets of system 400 are verified for continuity using the generated test sequences. In the preferred embodiment, the stuck drivers test of step 365 is followed by a shorts test 370 to detect any unintended short circuits among the set of nets 401 of system 400. Since the stuck drivers test ensures the integrity of each of node in system 400, the shorts test can be completed using just the first test sequence assuming that the first sequence results in each net being driven (i.e., there are no filler nodes in the first test sequence).

It is desirable to execute the shorted nets test with a single test sequence if possible to maximize the coverage of the test. To drive each net 401 of system 400 during the shorts test 370, the method step 320 of FIG. 3 referred to previously is utilized to ensure that each net is being driven during the first test sequence. (Although the first test sequence has been used throughout this disclosure as the sequence optimized for shorts testing, alternative embodiments may select an different sequence number). After identifying all commonly enabled nodes in step 310, the depicted embodiment of method 300 performs a step 320 in which logic reduction techniques are used to determine drivers that can be assigned to a first test sequence. In addition, however, complete coverage is achieved in a single sequence only if all nets are driven during the selected test sequence. Without a method of prioritizing the selected test sequence, an otherwise functional test sequence generation method might result in a set of test sequences in which one or more nets are not driven during the selected test sequence. Since it is desirable from the standpoint of simplicity, to use the first test sequence as the sequence for the shorted nets test, it is important to ensure that all nets are driven during the first test sequence if at all possible. In order to find an appropriate driver for the first test sequence on each net, a set of logic equations is generated for each net. Since only one group-enabled node can drive a net at one time, an equation of the form $(G1*\overline{G2}*\overline{G3}\ldots)+(\overline{G1}*G2*\overline{G3}\ldots)+(\overline{G1}*\overline{G2}*G3\ldots)\ldots$ (where * is the logical 'and' function and + is the logical 'or' function) is used to determine the possible solutions for a given net where the letter G is used to indicate the group enabled nodes that are part of the net. Referring to FIG. 4, for example, a logic equation indicating the possible sequence 1 drivers for the first net 401a would be of the form $(A.1*\overline{B.1})+(\overline{A.1}*B.1)$ to indicate that either A.1.1 or B.1.1 will drive net 401a but not both. If a dedicated (non-shared) driver is present on the net, then the possibility that the dedicated node will drive the net during the first sequence is accounted for by including the term $(\overline{G1}*\overline{G2}*\overline{G3})$ in the equation for a given net. Referring again to FIG. 4, an equation suitable for third net 401c is of the form $(A.1*\overline{C.1})+(\overline{A.1}*C.1)+(\overline{A.1}*\overline{C.1})$ in recognition of the possibility that dedicated node B.2.1 could drive the net during the first test sequence. The equations generated for each net are then ANDed together and conventional logic reduction techniques are employed to find one or more solutions for sequence one drivers. For system 400 of FIG. 4, the set of equations would include:

First net 401a: $(A.1*\overline{B.1}+\overline{A.1}*B.1)$

Second net 401b: $(B.1*\overline{C.1}+\overline{B.1}*C.1)$

Third net 401c: $(A.1*\overline{C.1}+\overline{A.1}*C.1+\overline{A.1}*\overline{C.1})$ Fourth net 401d: $(C.1*\overline{D.1}+\overline{C.1}*D.1)$ Fifth net 401e: $(C.1*\overline{D.1}+\overline{C.1}*D.1)$ Logical ANDing these equations together yields:

$(A.1*\overline{B.1}+\overline{A.1}*B.1)*(B.1*\overline{C.1}+\overline{B.1}*C.1)*(A1*\overline{C.1}+\overline{A.1}*C.1+\overline{A.1}*\overline{C.1})*(C.1*\overline{D.1}+\overline{C.1}*D.1)$ Using conventional logic reduction techniques to reduce this equation yields:

$\overline{A.1}*B.1*\overline{C.1}*D.1$

As the sequence 1 driver solution. Therefore, group enabled nodes B.1 and D.1 are chosen for the first sequence node in any net that includes either of these group enabled nodes. For a net such as third net 401c, to which neither B.1 nor D.1 are connected, non-group enabled node B.2.1 is selected as the first sequence driver. If the process described results in multiple solutions, one embodiment contemplates prioritizing dedicated nodes over group enabled nodes to provide the greatest degree of isolation. In other words, if an unusual problem occurs, such as multiple failures caused by a module being put in reset mode, the ability to isolate the source of the problem is limited if certain nets are driven by group enabled drivers. On the other hand, if all nets are driven by dedicated enables, the problem nets can be identified more quickly. If, for example, fourth net 401d and fifth net 401e each included a connection to a dedicated node, an additional solution $(\overline{A.1}*B.1*\overline{C.1}*\overline{D.1})$ is found. For this solution, the dedicated nodes drive their respective nets during the first sequence and group node D.1 drives its nets during the second test sequence. The preferred implementation would give preference to driving these nets with the dedicated drivers during sequence one. If step 320 produces no solution in which each net can be driven in a single sequence, the process is optimized by maximizing the number of nodes that are driven. If a net is encountered that eliminates all possible solutions while processing the nets one at at time, then the net is bypassed for the current set of solutions. An alternative set of solutions starting with the bypassed net is then generated, and the set of solutions that provides the maximum test coverage is selected.

Figure 6:
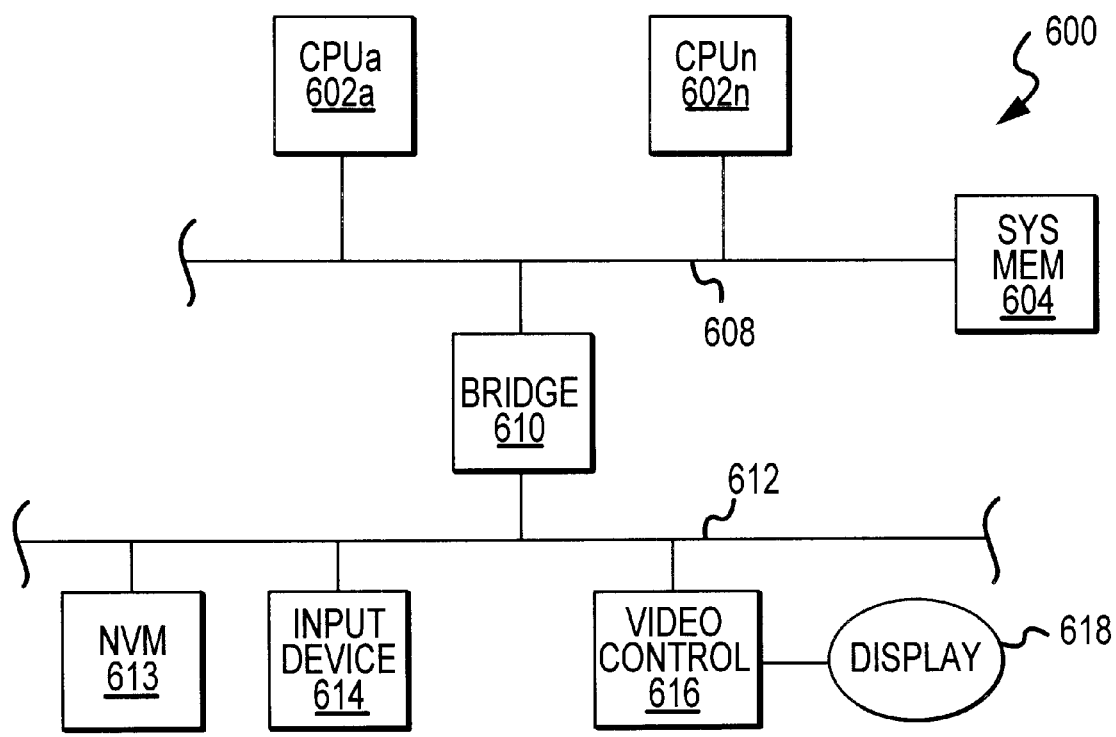
FIG. 6 is a simplified block diagram of a system suitable for use in conjunction with the test sequence generation method according to the present invention.

Referring now to FIG. 6, a system 600 suitable for use in connection with the method described in the preceding paragraphs is depicted in simplified block diagram fashion. The invention may be run on a variety of computers or collection of computers under a number of different operating systems. The computer could be, for example, a personal computer, a mini computer, mainframe computer or a computer running in a distributed network of other computers. In the depicted embodiment of system 600, one or more central processing units 602a . . . 602n (CPU's 602) interconnected via a system bus 608. A system memory 604 is accessible to CPU's 602 via system bus 608. A bus bridge 610 provides a communication path between system bus 608 and an I/O bus 612. I/O bus 612 may comply with any of a variety of standardized I/O bus architectures including the ISA, PCI, EISA, MCA, and AGP bus architectures. In addition, system 600 may include multiple bus bridges that enable system bus 608 to communicate with multiple I/O busses of differing bus architectures. CPU's 602 are supported by a non-volatile memory (NVM) unit 613, preferably implemented as a flash memory module or as a read only memory (ROM) device and contains the microcode necessary to configure the various components of system 600 and restore system 600 to a state in which the system's basic operation system is functional. An input device 614 such as a keyboard or pointing device is interfaced to I/O bus 614 as well as a video controller 616 that controls a display screen 618. Video controller 616 may include dedicated graphics adapter hardware and a frame buffer memory to improve the graphics performance of system 600. One of the embodiments of the invention can be implemented as sets of instructions resident in system memory 604 of computer system 600 configured generally as described in FIG. 6. Until required by system 600, the set of instructions may be stored in another computer readable memory or computer program product, for example in a hard disk drive, or in a removable memory such as an optical disk for eventual use in a CD-ROM drive or a floppy disk for eventual use in a floppy disk drive. Further, the set of instructions can be stored in the memory of another computer and transmitted over a local area network or a wide area network, such as the Internet, when desired by the user. One skilled in the art would appreciate that the physical storage of the sets of instructions physically changes the medium upon which it is stored electrically, magnetically, or chemically so that the medium carries computer readable information.

It will be apparent to those skilled in the art having the benefit of this disclosure that the present invention contemplates minimizing or reducing the number of sequences required to test an electronic system and maximizing the number of nets driven during the shorted nets test while simultaneously accounting for the possibility of multiple system nodes that are enabled via a common enable latch. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A method for determining sequences for testing an electronic system comprising a plurality of nets, each net comprising at least one node, the method comprising:

identifying commonly enabled nodes within the system and associating each commonly enabled node with a node group, wherein the commonly enabled nodes comprising each node group share a common enable;

identifying contending node group pairs, wherein a contending node group pair comprises a first node group and a second node group wherein at least one commonly enabled node of the first node group and at least one node of the second node group reside on a common net; and assigning sequence numbers to each commonly enabled node in the system, wherein the sequence numbers for each node within a node group are the same and further wherein sequence numbers associated with pairs of contending node groups differ.

2. The method of claim 1, further comprising, identifying nodes eligible for driving their respective nets during a selected test sequence and reserving the selected test sequence for the eligible nodes.

3. The method of claim 2, wherein the selected test sequence is the first test sequence.

4. The method of claim 1, wherein the steps of identifying contending node group pairs and assigning sequence numbers to each commonly enabled node comprise:

for each net in the system:
      for each node in the current net:
         assigning a sequence number to the current node if the node is commonly enabled;
         determining whether the sequence number assigned to the current commonly enabled node results in intrasequence contention with a commonly enabled node of a previous net and, if so;
         determining a new sequence number for the current commonly enabled node, wherein the new sequence number does not result in intrasequence contention; and
         assigning the new sequence number to commonly enabled nodes occurring in previous nets from the same node group as the current commonly enabled node.

5. The method of claim 4, wherein the step of assigning a sequence number to the current commonly enabled node comprises assigning the lowest sequence number not assigned to another node of the current net.

6. The method of claim 4, wherein the step of assigning a sequence number to a commonly enabled node includes determining whether a commonly enabled node from the same node group was previously assigned a sequence number and, if so, assigning the same sequence number to the current node.

7. The method of claim 4, wherein the step of determining whether intrasequence contention occurs comprises determining whether the assigned sequence number was previously assigned to another node group with which the current node group forms a contending pair.

8. The method of claim 1, further comprising using the assigned sequences to perform a stuck drivers test on each node of system, wherein the sequence determines the order in which the node drives its corresponding net.

9. The method of claim 8, further comprising, using the selected sequence to conduct a shorts test on each net.

10. The method of claim 9, wherein the step of conducting the shorts test comprises driving each net with the node assigned to the net's first sequence.

11. A computer program product in a computer readable memory for determining testing sequences for an electronic system, the product comprising:

means for identifying commonly enabled nodes within the system and associating each commonly enabled node with a node group, wherein the commonly enabled nodes comprising each node group share a common enable;

means for identifying contending node group pairs, wherein a contending node group pair comprises a first node group and a second node group wherein at least one commonly enabled node of the first node group and at least one node of the second node group reside on a common net; and means for assigning sequence numbers to each commonly enabled node in the system, wherein the sequence numbers for each node within a node group are the same and further wherein sequence numbers associated with pairs of contending node groups differ.

12. The computer program product of claim 11, further comprising means for identifying nodes eligible for driving their respective nets during a selected test sequence and reserving the selected test sequence for the eligible nodes.

13. The computer program product of claim 12, wherein the selected test sequence is the first test sequence.

14. The computer program product of claim 11, wherein the means for identifying contending node group pairs and assigning sequence numbers to each commonly enabled node comprise:

means for assigning a sequence number to the current commonly enabled node;
    means for determining whether the sequence number assigned to the current commonly enabled node results in intrasequence contention with a commonly enabled node of a previous net;
    means for determining a new sequence number for the current commonly enabled node, wherein the new sequence number does not result in intrasequence contention; and
    means assigning the new sequence number to commonly enabled nodes occurring in previous nets from the same node group as the current commonly enabled node.

15. The computer program product of claim 11, further comprising, means for using the assigned sequences to perform a stuck drivers test on each node of system, wherein the sequence determines the order in which the node drives its corresponding net.

16. The computer program product of claim 15, further comprising, means for using the selected sequence to conduct a shorts test on each net.

17. The computer program product of claim 16, wherein the means for conducting the shorts test comprises means for driving each net with the node assigned to the net's first sequence.

18. A system including processor, memory, display and input device for generating sequences for testing a set of nodes interconnected via a set of nets, comprising:

means for identifying commonly enabled nodes within the system and associating each commonly enabled node with a node group, wherein the commonly enabled nodes comprising each node group share a common enable;

means for identifying contending node group pairs, wherein a contending node group pair comprises a first node group and a second node group wherein at least one commonly enabled node of the first node group and at least one node of the second node group reside on a common net; and means for assigning sequence numbers to each commonly enabled node in the system, wherein the sequence numbers for each node within a node group are the same and further wherein sequence numbers associated with pairs of contending node groups differ.

19. The system of claim 18, further comprising means for identifying nodes eligible for driving their respective nets during a selected test sequence and reserving the selected test sequence for the eligible nodes.

20. The system of claim 19, wherein the selected test sequence is the first test sequence.

21. The system of claim 18, wherein the means for identifying contending node group pairs and assigning sequence numbers to each commonly enabled node comprise:

means for assigning a sequence number to the current commonly enabled node;

means for determining whether the sequence number assigned to the current commonly enabled node results in intrasequence contention with a commonly enabled node of a previous net;

means for determining a new sequence number for the current commonly enabled node, wherein the new sequence number does not result in intrasequence contention; and means assigning the new sequence number to commonly enabled nodes occurring in previous nets from the same node group as the current commonly enabled node.

22. The system of claim 18, further comprising, means for using the assigned sequences to perform a stuck drivers test on each node of system, wherein the sequence determines the order in which the node drives its corresponding.

23. The system of claim 22, further comprising, means for using the selected sequence to conduct a shorts test on each net.

24. The system of claim 23, wherein the means for conducting the shorts test comprises means for driving each net with the node assigned to the net's first sequence.

* * * * *